(12) United States Patent
Cheng et al.

(10) Patent No.: US 9,209,130 B2
(45) Date of Patent: Dec. 8, 2015

(54) SEMICONDUCTOR DEVICE HAVING GROUND SHIELD STRUCTURE AND FABRICATION METHOD THEREOF

(71) Applicant: Semiconductor Manufacturing International (Shanghai) Corporation, Shanghai (CN)

(72) Inventors: Jenhao Cheng, Shanghai (CN); Xining Wang, Shanghai (CN); Ling Liu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 71 days.

(21) Appl. No.: 14/028,733

(22) Filed: Sep. 17, 2013

(65) Prior Publication Data
US 2014/0117496 A1 May 1, 2014

(30) Foreign Application Priority Data
Oct. 30, 2012 (CN) .......................... 2012 1 0425591

(51) Int. Cl.
*H01L 27/08* (2006.01)
*H01L 21/8222* (2006.01)
*H01L 23/522* (2006.01)
*H01L 23/552* (2006.01)
*H01L 49/02* (2006.01)

(52) U.S. Cl.
CPC ........ *H01L 23/5227* (2013.01); *H01L 23/5225* (2013.01); *H01L 23/552* (2013.01); *H01L 28/10* (2013.01); *H01L 2924/0002* (2013.01)

(58) Field of Classification Search
CPC ............ H01L 21/768; H01L 21/76816; H01L 21/76838; H01L 21/28026; H01L 21/823475; H01L 21/823871; H01L 23/552; H01L 25/16; H01L 27/14636; H01L 2224/19; H01L 2224/25; H01L 2225/06541
USPC ......... 257/774, 522, 419, 773, 758, 737, 499, 257/762, 764, 506, 531; 438/303, 591, 618, 438/421, 584, 637, 783, 763
See application file for complete search history.

(56) References Cited

U.S. PATENT DOCUMENTS

| | | | | |
|---|---|---|---|---|
| 5,109,267 | A * | 4/1992 | Koblinger et al. | 257/760 |
| 2005/0205990 | A1 * | 9/2005 | Wang et al. | 257/730 |
| 2008/0048294 | A1 * | 2/2008 | Yamamoto | 257/536 |
| 2009/0140428 | A1 * | 6/2009 | Bonilla et al. | 257/751 |
| 2009/0250262 | A1 | 10/2009 | Jin | |
| 2009/0272973 | A1 * | 11/2009 | Yoshida et al. | 257/48 |
| 2010/0059855 | A1 * | 3/2010 | Lin et al. | 257/528 |
| 2010/0295178 | A1 * | 11/2010 | Ishihara et al. | 257/737 |
| 2011/0248363 | A1 * | 10/2011 | Fujii | G01L 9/0005 257/415 |

* cited by examiner

*Primary Examiner* — Selim Ahmed
*Assistant Examiner* — Moin Rahman
(74) *Attorney, Agent, or Firm* — Anova Law Group, PLLC (57) ABSTRACT

Semiconductor devices having a ground shield structure and methods for their formation are provided herein. An exemplary semiconductor device can include a substrate, a ground ring, a ground shield, an electronic device, and/or an insulation layer. The ground ring can be disposed over the substrate. The ground shield can be disposed over the substrate and surrounded by the ground ring. The ground shield can include a plurality of coaxial conductive wirings and a metal wire passing through the plurality of coaxial conductive wirings along a radial direction. The metal wire can be connected to the ground ring. The electronic device can be disposed over the ground shield. The insulation layer can be disposed between the ground shield and the electronic device.

20 Claims, 6 Drawing Sheets

SEMICONDUCTOR DEVICE HAVING GROUND SHIELD STRUCTURE AND FABRICATION METHOD THEREOF

CROSS-REFERENCES TO RELATED APPLICATIONS

This application claims priority to Chinese Patent Application No. CN201210425591.8, filed on Oct. 30, 2012, the entire contents of which are incorporated herein by reference.

FIELD OF THE DISCLOSURE

The present disclosure relates to the field of semiconductor technology and, more particularly, relates to a semiconductor device having a ground shield structure.

BACKGROUND

In integrated circuits (ICs), such as CMOS (i.e., complementary metal-oxide-semiconductor) RFIC (i.e., radio frequency integrated circuit), inductors are important circuitry component. Performance parameters of the inductors may directly affect the performance of the ICs. Current ICs often include planar inductors such as, for example, planar spiral inductors. A planar inductor can be formed by winding conductive metal wires on surface of a substrate or a dielectric layer of an IC device. Compared with other conventional wire-winding inductors, a planar inductor typically has low cost with ease of device integration, low noise, and low power consumption. More importantly, planar inductors are compatible with current ICs.

Quality factor (Q) of an inductor device can be defined as a ratio of the energy stored in the inductor to the energy loss per oscillation cycle. Therefore, the higher the quality factor (Q) of the inductor device, the higher the efficiency and the performance can be. Conventional planar inductors, however, have low Q, which leads to poor inductor performance and thereby affects performance of the IC devices. Additionally, in standard CMOS processing, the metal wirings of a spiral inductor can have high resistance. This may cause a large silicon substrate loss at high frequencies. Thus, the quality factor (Q) of a silicon-based spiral inductor is generally low.

Electric field generated in the inductor may induce opposite charges at corresponding parts of the substrate, and AC voltage difference between different parts of the inductor may induce AC voltage difference between the corresponding parts of the substrate. For a semiconductor substrate, such voltage difference can generate a current called capacitive coupling substrate current, which may cause ohmic losses.

Even though a planar spiral and a vertical stacked inductor are both compatible with IC interconnect structures, magnetic field generated from such inductors can pass vertically through the substrate. According to Lenz's law, an alternating magnetic field of the inductor can induce an alternating eddy current on the substrate. The eddy current can dissipate the electric energy, which is converted from magnetic energy, through Joule heating. The eddy current flows in an opposite direction of the inductor current, thus the magnetic field induced by the eddy current is opposite to the magnetic field from the inductor. This may lower the inductance of the inductor.

Standard CMOS substrate is a semiconductor. At high frequencies, the substrate loss is the major contributor to the inductor loss. Currently, a ground shield is commonly used to reduce the substrate loss of an inductor.

Figure 1:
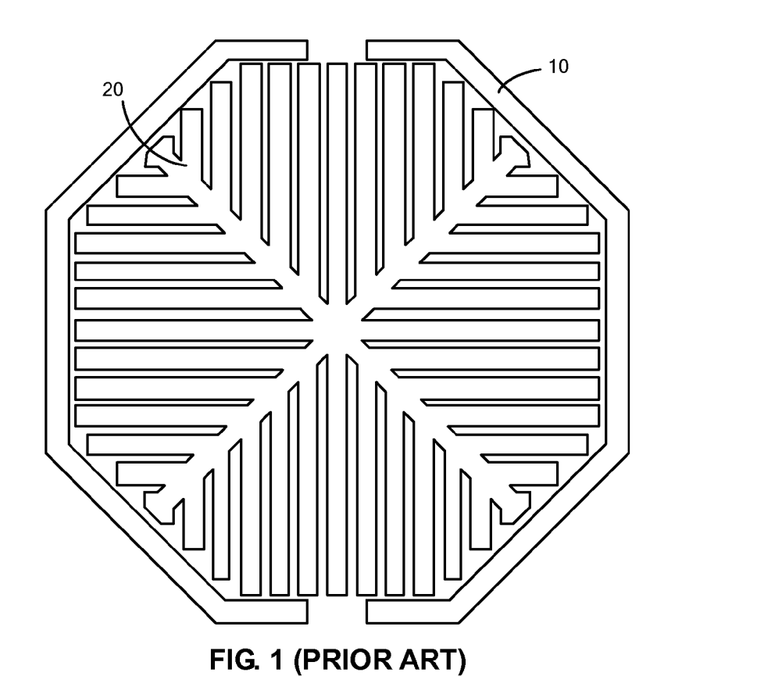
FIG. 1 depicts a top view of a conventional ground shield.

FIG. 1 shows a top view of a conventional ground shield. As shown in FIG. 1, the ground shield includes a ground ring 10 and a pattern 20 disposed within the ground ring. The pattern 20 can be made of a semiconductor material. Since the pattern 20 has a lower resistance than the substrate, it may terminate the electric field from the inductor and shield the electric field from going to the substrate. This may avoid generating a substrate current and lower the energy loss of the substrate. However, the pattern may induce a large coupling capacitance at high frequencies. In addition, the shield (e.g. pattern 20) has a large contact area in the middle, which may induce a large eddy current loss and reduce the quality factor (Q) of the inductor.

BRIEF SUMMARY OF THE DISCLOSURE

According to various embodiments, there is provided a semiconductor device. The semiconductor device can include a substrate, a ground ring, a ground shield, an electronic device, and an insulation layer. The ground ring can be disposed over the substrate. The ground shield can be disposed over the substrate and surrounded by the ground ring. The ground shield can include a plurality of coaxial conductive wirings and a metal wire passing through the plurality of coaxial conductive wirings along a radial direction. The metal wire can be connected to the ground ring. The electronic device can be disposed over the ground shield. The insulation layer can be disposed between the ground shield and the electronic device.

According to various embodiments, there is also provided a method for forming a semiconductor device. A ground ring can be provided over a substrate. A ground shield can be formed over the substrate and surrounded by the ground ring. The ground shield can include a plurality of coaxial conductive wirings and a metal wire passing through the plurality of coaxial conductive wirings along a radial direction. The metal wire can be connected to the ground ring. An electronic device can be provided over the ground shield. An insulation layer can be formed between the ground shield and the electronic device.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

A ground shield may induce a large coupling capacitance at high frequencies and have a large contact area in the middle, which may generate large eddy current loss that reduces high quality factor (Q) of the inductor. As disclosed herein, semiconductor devices with ground shields are provided. The ground shield can be formed on a substrate, surrounded by a ground ring, and disposed under electronic device(s). An exemplary ground shield structure can include a plurality of coaxial conductive wirings (e.g., rings) and a metal wire passing in the radial direction through the conductive rings. Also, the metal wire can be connected to the ground ring. The ground shield fabricated in accordance with various disclosed embodiments can effectively reduce coupling capacitance, thereby lowering eddy current loss.

Figure 2:
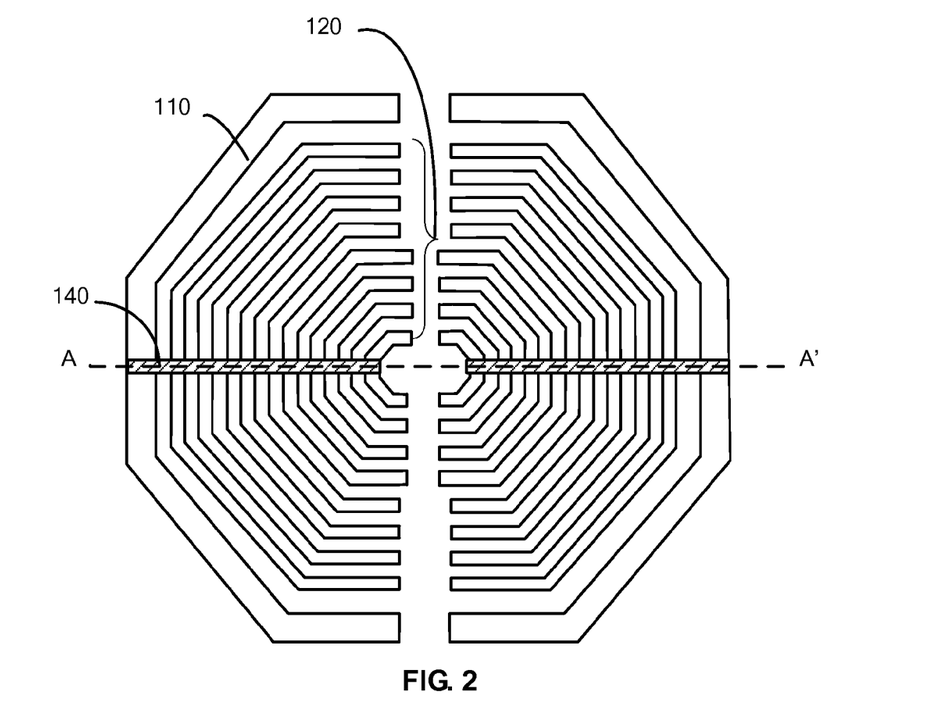
FIG. 2 depicts a top view of an exemplary ground shield and ground ring in accordance with various disclosed embodiments.

FIG. 2 depicts a top view of an exemplary ground shield and ground ring in accordance with various disclosed embodiments. Although not illustrated in FIG. 2, the exemplary ground shield and ground ring can further include a substrate, an isolation structure, and a dielectric layer.

The exemplary ground shield depicted in FIG. 2 can include first active wirings 120 and a metal wire 140. The exemplary ground shield can connect to the ground through ground ring(s) 110.

Figure 3:
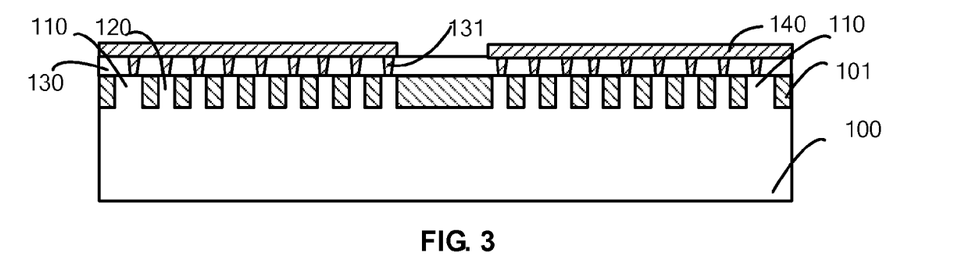
FIG. 3 depicts a cross-sectional view of an exemplary ground shield and ground ring in accordance with various disclosed embodiments.

For example, the first active wirings 120 can be disposed over a substrate (e.g., substrate 100 in FIG. 3). In some embodiments, the total number of the first active wirings 120 can be about 8 or any other suitable number. For example, the number of the first active wirings can be an arbitrary number from 2 to 100, for example, about 10, 20, or 50. The first active wirings 120 can have octagonal shapes. The first active wirings 120 can be coaxial and/or can be formed of active rings.

In one embodiment, the ground ring 110 can be located outside of the first active wirings 120 and can surround the first active wirings 120. The ground ring 110 can have, e.g., an octagonal shape. In other embodiments, the ground ring 110 may have the same or different shape of the first active wirings of the ground shield. The width of the first active wirings 120 and the ground ring 110 can be, e.g., about 0.1 μm to about 100 μm.

In one embodiment, the ground ring 110 and each of the first active wirings 120 can have two openings, and the openings are lined up and perpendicular to the direction of AA' as shown in FIG. 2. That is, the two openings are opposite to each other, e.g., at two sides of the metal wire 140. Further, the metal wire 140 can connect the first active wirings 120 outwards to the ground ring 110, e.g., via plugs (not shown). In other embodiments, the first active wirings may also have one opening, and it may be located at an arbitrary position of the first active wirings.

FIG. 3 depicts a cross-sectional view of the ground shield and ground ring in AA' direction in FIG. 2. For example, the exemplary ground shield structure can include a substrate 100, the first active wirings 120 disposed over the substrate, the ground ring 110 formed outside the first active wirings 120, and shallow isolation trenches 101 formed between adjacent first active wirings 120 and between the ground ring 110 and the neighboring first active wiring 120. The first active wirings 120 and the ground ring 110 can be formed directly on the substrate by, e.g., etching and doping. Or, the first active wirings 120 and the ground ring 110 can be formed by etching a pre-formed epitaxial layer on the substrate.

The exemplary ground shield structure can also include a first dielectric layer 130 disposed over the surfaces of the first active wirings 120, the ground ring 110 and the shallow isolation trenches 101; and conductive plugs 131 disposed through a thickness (e.g., an entire thickness) of the first dielectric layer 130. One end of the conductive plug 131 can be connected to the surface of one of the first active wirings 120 and the other end of the conductive plug 131 can be connected to the metal wire 140 disposed over the first dielectric layer. The metal wire 140 can connect the first active wirings on both sides of the opening outwards the ground ring 110 via conductive plugs. In one embodiment, the first active wirings 120 can be P-doped or N-doped to provide less resistance than the substrate. In other embodiments, a metal silicide layer can be formed on the first active wirings 120 to reduce the resistance.

The substrate 100 can be made of a material including, e.g., silicon, germanium, silicon-on-insulator, silicon carbide, germanium silicon, gallium nitride and/or glass. The substrate 100 can be made of a homogeneous material or a composite material such as silicon-on-insulator. The substrate 100 can also have doped well(s) that can have an opposite doping type of the substrate. Most of the substrates in various disclosed embodiments are made of P type semiconductors, and the use of PN junction isolation can reduce the coupling capacitance between the inductor and the substrate. Depending on specific semiconductor device to be formed thereon, certain substrate can be selected.

When the metal wire is connected to the ground through the ground ring, a junction between the metal wire and first active wiring(s) can have a fixed potential. However, because the metal wire has resistance and an individual coaxial active wiring can have certain length and resistance, the potentials for the positions away from the junctions may be different, and coupling capacitance may appear at high frequencies. That is, for high frequency signals, potential difference may be produced. At high frequencies, the unconnected regions between adjacent wirings can form equivalent series coupling capacitors. An active wiring in the middle can serve as the lower plate of a coupling capacitor formed with an adjacent inner active wiring, at the same time this active wiring in the middle can also serve as the upper plate of a coupling capacitor formed with an adjacent outer active wiring. The more number of conductive wirings within one layer, the more the equivalent series coupling capacitors can be generated, and the smaller the capacitance can be. Reducing the coupling capacitance can reduce the energy loss of the electronic device(s) formed on top of the ground shield.

Figure 4:
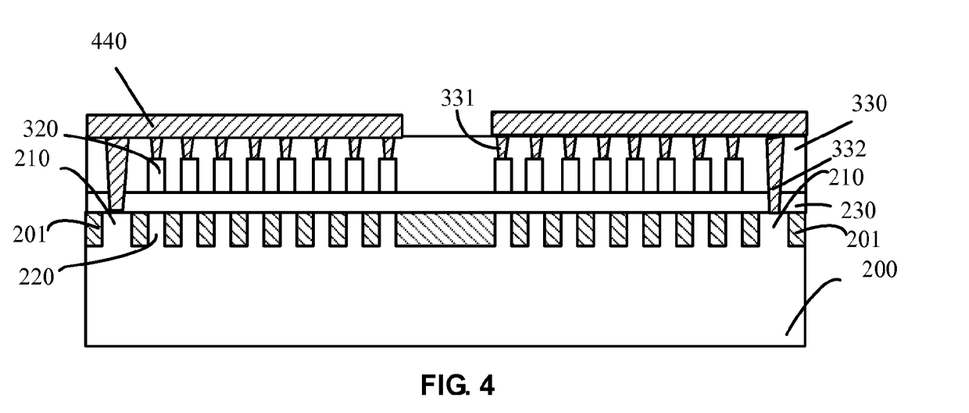
FIG. 4 depicts a cross-sectional view of another exemplary ground shield and ground ring in accordance with various disclosed embodiments.
Figure 5:
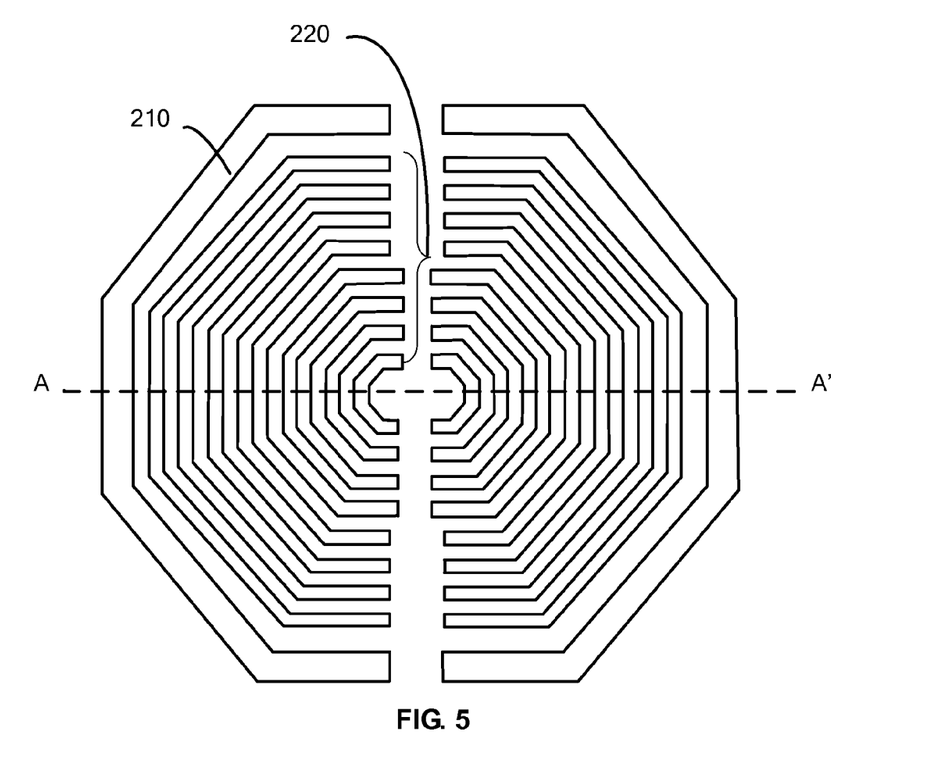
FIG. 5 depicts a top view of first active wirings of an exemplary ground shield and second active wirings of an exemplary ground ring in accordance with various disclosed embodiments.
Figure 6:
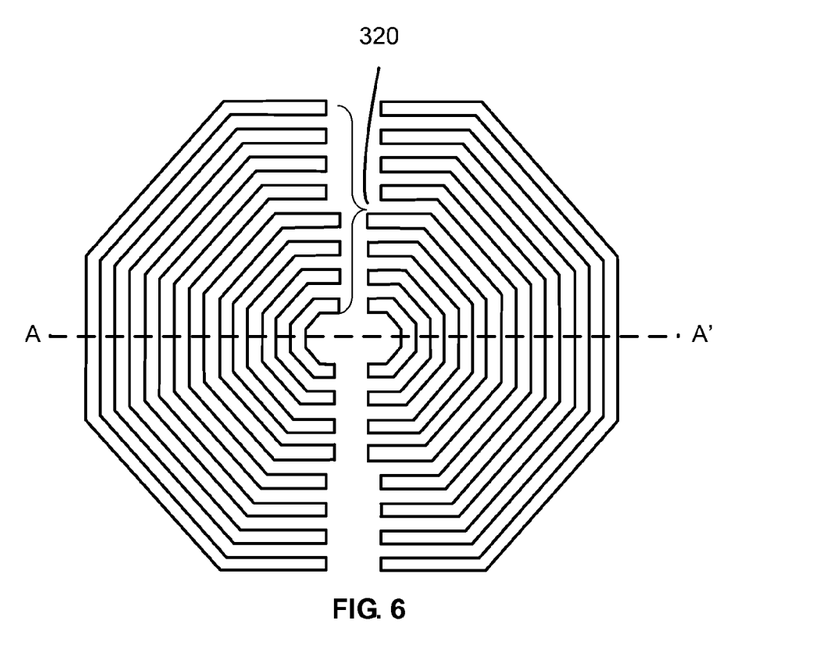
FIG. 6 depicts a top view of polysilicon wirings of an exemplary ground shield in accordance with various disclosed embodiments.
Figure 7:
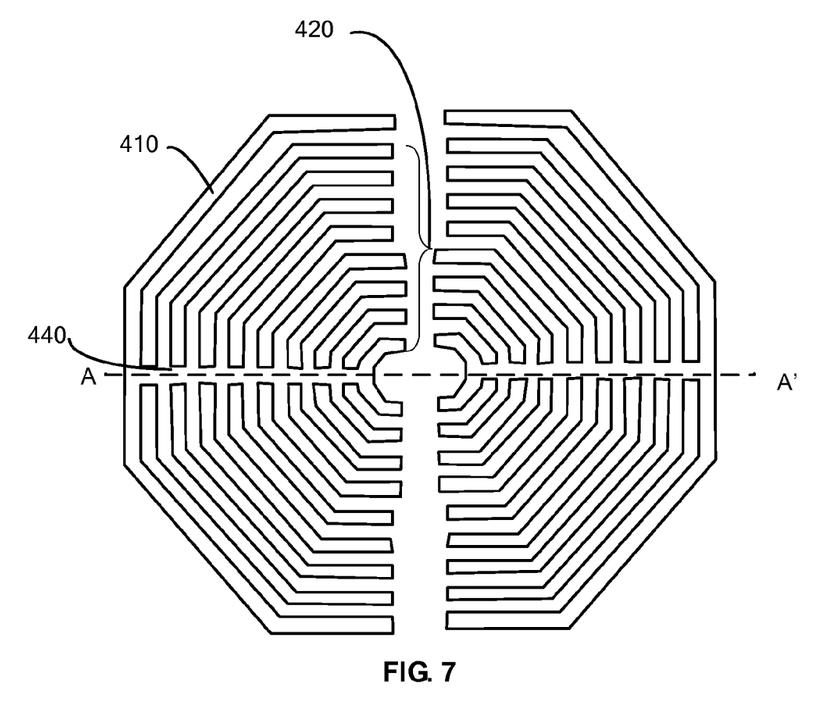
FIG. 7 depicts a top view of first metal wirings of an exemplary ground shield, second metal wirings of an exemplary ground ring, and a metal wire in accordance with various disclosed embodiments.

Referring to FIGS. 4-7, FIG. 4 depicts a cross-sectional view of an exemplary ground shield and ground ring; FIG. 5 depicts a top view of the first active wirings 220 of the exemplary ground shield and second active wirings 210 of the exemplary ground ring; FIG. 6 depicts a top view of polysilicon wirings of the exemplary ground shield; FIG. 7 depicts a top view of first metal wirings 420 of the exemplary ground shield, second metal wirings 410 of the exemplary ground ring, and a metal wire 440 in accordance with various disclosed embodiments.

For example, FIG. 4 depicts a cross-sectional view of the exemplary ground shield in AA' direction shown in each of FIGS. 5-7. In one embodiment, the ground shield can include the first active wirings 220, the polysilicon wirings 320, and the first metal wirings 420 (e.g., as shown in FIG. 7) and a metal wire 440 (e.g., as shown in FIG. 7). The ground ring can include the second active wirings 210 and the second metal wirings 410 (see FIG. 7).

In various embodiments, an exemplary ground shield can include a substrate 200; the first active wirings 220 disposed over the surfaces of the substrate 220; the shallow isolation trenches 201 formed between adjacent active wirings 220; a first dielectric layer 230 disposed over the surfaces of the first active wirings 220, the second active wirings 210, and the shallow isolation trenches 201. The polysilicon wirings 320 and a second dielectric layer 330 disposed over the first dielectric layer; the second metal wirings 410 (e.g., FIG. 7) disposed over the second dielectric layer 330; first conductive plugs 331 disposed through a thickness (or an entire thickness) of the second dielectric layer 330. One end of the conductive plugs 331 can connect to the polysilicon wirings 320 and the other end of the conductive plugs 331 can connect to the first metal wire 440.

An exemplary ground ring can include the second active wirings 210 that can be located outside of the first active wirings 220 and surrounding the first active wirings 220; the second metal wirings 410 (e.g., as shown in FIG. 7) that can be located outside of the first metal wirings 420 and surrounding the first metal wirings 420. The second metal wirings can connect with the second active wirings via the second conductive plug 332. The second conductive plug 332 can be disposed through a thickness (or an entire thickness) of the first dielectric layer 230 and the second dielectric layer 330. One end of the second conductive plug 332 can connect to the second active wirings 210 and the other end of the second conductive plug 332 can connect to the second metal wirings 410 (e.g., as shown in FIG. 7).

The substrate 200 can be made of a material including, e.g., silicon, germanium, silicon-on-insulator, silicon carbide, germanium silicon, gallium nitride and/or glass. The substrate 200 can be made of a homogeneous material or a composite material such as silicon-on-insulator. The substrate 200 can also have doped well(s) that can have an opposite doping type of the substrate. Most of the substrates in various disclosed embodiments are made of P type semiconductors, and the use of PN junction isolation can reduce the coupling capacitance between the inductor and the substrate. Depending on specific semiconductor device to be formed thereon, certain substrate can be selected.

FIG. 5 depicts a top view of the first active wirings 220 as the exemplary ground shield and the second active wirings 210 as the exemplary ground ring in accordance with various disclosed embodiments. In one embodiment, the first active wirings 220 can have a total number of, e.g., 8 wirings (or rings) and/or any other suitable numbers of wirings. In other embodiments, the number of the first active wirings can be an arbitrary number, e.g., from about 2 to about 100, such as, about 10, 20, or 50. The first active wirings 220 and the second active wirings 210 can have, e.g., octagonal shapes. The width of the first and second active wirings can be, e.g., about 0.1 μm to about 100 μm. In addition, each of the first active wirings and the second active wirings can have two openings, and the openings can be lined up perpendicular to the direction of AA' as shown in FIG. 5. In certain embodiments, each of the first active wirings and the second active wirings may have one opening arbitrarily arranged, for example, the openings of the first active wirings and the second active wirings can be lined up perpendicular to the direction of AA'. The first active wirings 220 and the second active wirings 210 can be formed directly in the substrate, or they can be formed by etching a pre-formed epitaxial layer disposed over the substrate. In various embodiments, the first and the second active wirings can have the same or different shapes.

FIG. 6 depicts a top view of polysilicon wirings of the exemplary ground shield in accordance with various disclosed embodiments. In one embodiment, the polysilicon wirings 320 can have a total number of about 8 wirings (e.g., rings) or any other suitable number of wirings. In other embodiments, the number of the polysilicon wirings can be an arbitrary number from about 2 to about 100, for example, about 10, 20, or 50. The polysilicon wirings can have octagonal shapes, and the width of the wirings can be about 0.1 μm to about 100 μm. Additionally, each wiring of the polysilicon wirings 320 can have two openings opposite to each other, and the openings can be lined up perpendicular to the direction of AA' as shown in FIG. 6. In certain other embodiments, each of the polysilicon wirings may have only one opening arranged as desired. The polysilicon wirings 320 can be disposed over the first dielectric layer 230.

FIG. 7 depicts a top view of the first metal wirings 420 of the exemplary ground shield, the second metal wirings 410 of the exemplary ground ring, and a metal wire 440 in accordance with various disclosed embodiments.

For example, the first metal wirings 420 and the second metal wirings 410 and the metal wire 440 can be disposed over the second dielectric layer 330 as shown in FIG. 4. The second metal wirings 410 can be located outside the first metal wirings 420, and can surround the first metal wirings 420. In one embodiment, the first metal wirings 420 can have a total number of about 8 wirings (or rings) or any other suitable number of the wirings. In certain embodiments, the number of the first metal wirings 420 can be an arbitrary number from about 2 to about 100, for example, about 10, 20, or 50. The first metal wirings 420 and the second metal wirings 410 can have octagonal shapes, and the width of each of the first metal wirings 420 and the second metal wirings 410 can be about 0.1 μm to about 100 μm. Each of the second metal wirings 410 and the first metal wirings 420 can have two openings opposite to each other, and the openings can be lined up perpendicular to the direction of AA' and can divide the ground shield structure into two bilaterally symmetrical parts. In certain other embodiments, each of the first and second metal wirings may have only one opening. The metal wire 440 can connect the first metal wirings 420 from inside outwards the second metal wirings 410. The first and second metal wirings can be made of a material including, e.g., copper and/or aluminum. The metal wire 440 can make equipotential connection of the first metal wirings 420 from the inside to the outside, and can connect to the ground via the second metal wirings 410 of the ground ring.

In certain embodiments, the second metal wirings disposed over the ground shield may have a multilayer structure. The top metal wirings 420 can connect to the ground ring from the inside to the outside via the metal wire, and the interlayer can have a dielectric layer and an equipotential conductive plug.

The second active wirings 210 of the ground ring and the second metal wirings 410 can connect to the ground. The ground ring with openings can absorb the electric field traveling from the ground shield above, thereby preventing crosstalk between the inductor and the circuits in the vicinity, and effectively isolating the substrate noise.

In one embodiment, the first dielectric layer 230 and the second dielectric layer 330 can be made of a material including, e.g., silicon oxide and/or silicon nitride. The first conductive plug 331 and the second conductive plug 332 can be made of a material including, e.g., tungsten, aluminum and/or copper.

In certain embodiments, the structure of the ground shield can be either a single-layer or a stacked multi-layer. When the structure of the ground shield is a single-layer, conductive wirings can be used as, for example, active wirings of an active layer disposed over the substrate, the polysilicon wirings of the polysilicon layer disposed over the substrate, or the metal wirings of the metal layer disposed over the substrate. When the structure of the ground shield is a stacked multi-layer, the ground shield structure can include one of the following: active wirings of an active layer formed on the substrate and polysilicon wirings of a polysilicon layer formed on the active layer; active wirings of an active layer formed on the substrate and metal wirings of a metal layer formed on the active layer; polysilicon wirings of a polysilicon layer formed on the substrate and metal wirings of a metal layer formed on the active layer; active wirings of an active layer formed on the substrate, polysilicon wirings of a polysilicon layer formed on the active layer and metal wirings of a metal layer formed on the polysilicon layer. The metal wirings can have single-layer or stacked multi-layer structure, and the metal wire can pass through the conductive wirings of the single-layer and connect to the ground ring, or pass through the uppermost conductive wirings of the stacked multi-layer and connect to the ground ring.

The active wirings, the polysilicon wirings, and the single or multi-layer metal wirings can have, e.g., triangular, square, circular or octagonal shapes. The width may be from about 0.1 μm to about 100 μm. Within a same layer, the conductive wirings can have about 2 to about 100 wirings, and each conductive wiring may have one or two openings. The openings of active wirings, polysilicon wirings and metal wirings in a single layer can be placed in an arbitrary position, and the number and position of openings can be the same or different in different layers.

Figure 8:
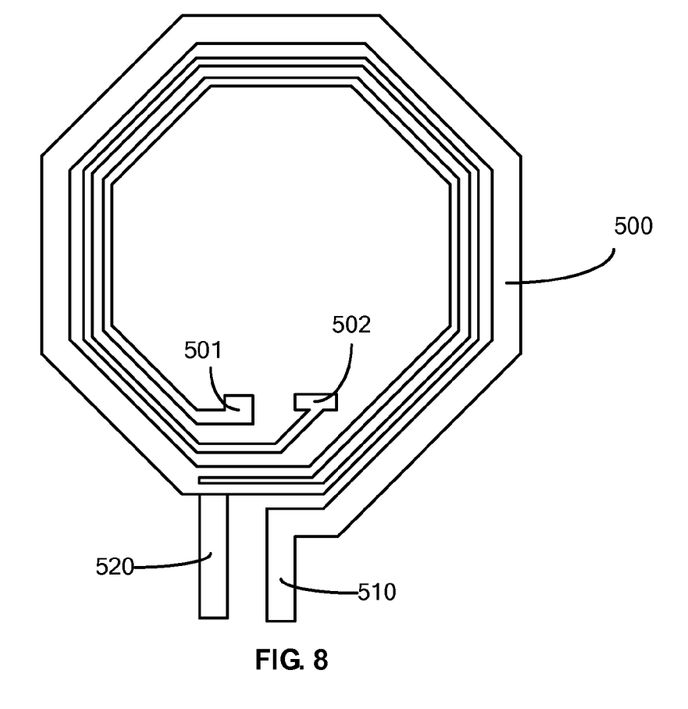
FIG. 8 depicts a top view of a first planar spiral wiring of an inductor disposed over an exemplary ground shield in accordance with various disclosed embodiments.
Figure 9:
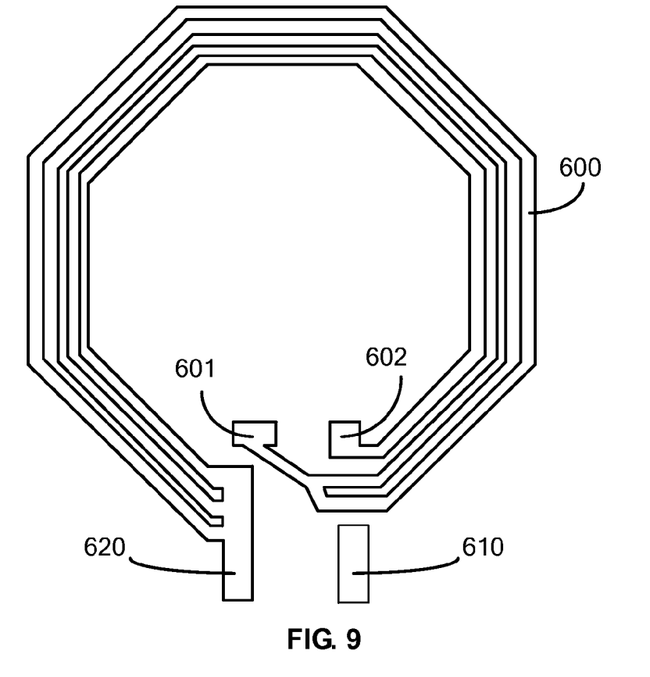
FIG. 9 depicts a top view of a second planar spiral wiring of an inductor disposed over an exemplary ground shield in accordance with various disclosed embodiments.

In certain embodiments, the semiconductor device having the ground shield can include an inductor disposed over the ground shield structure, and the inductor can be a planar spiral inductor. Referring to FIGS. 8 and 9, FIG. 8 depicts a top view of a first planar spiral wiring of an inductor over an exemplary ground shield structure; and FIG. 9 depicts a top view of a second planar spiral wiring of an inductor over an exemplary ground shield in accordance with various disclosed embodiments.

Figure 11:
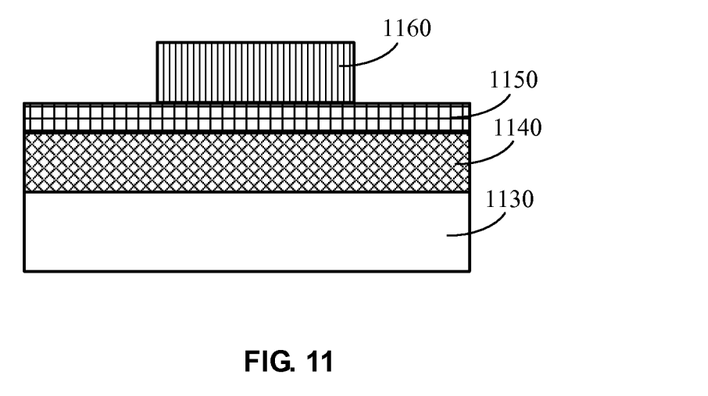
FIG. 11 depicts an exemplary semiconductor device having a ground shield in accordance with various disclosed embodiments.

Referring to FIG. 11, in a certain embodiment, a device 1160, such as an inductor including the first planar spiral wiring shown in FIG. 8 can be disposed over an insulation layer 1150, which is on top of an exemplary ground shield structure 1140 as disclosed herein. The exemplary ground shield structure 1140 can be any ground shield structure shown in FIGS. 2-5 and 7. In FIG. 11, the ground shield structure 1140 can be formed over a substrate 1130, which is consistent with the structures shown in FIGS. 3-4. having a ground shield structure (including a ground shield and a ground ring) formed on the substrate 100 or 200. The first planar spiral wiring can include a first metal wiring 500, a contact point 501 a contact point 502, a contact pad 510 and a contact pad 520.

Referring to FIG. 9, in a certain embodiment, the second planar spiral wiring can be disposed over the first planar spiral wiring, and the first and second planar spiral wirings can have a dielectric layer there-between. The second planar spiral wiring can include a metal wiring 600, a contact point 601, a contact point 602, a contact pad 610 and a contact pad 620.

The contact points of the first planar spiral wiring can be connected to the contact points of the second planar spiral wiring by a conductive plug disposed through a thickness of the dielectric layer between the first and second planar spiral wirings. For example, the contact point 601 can be connected to the contact point 501 via a conductive plug, the contact point 602 can be connected to the contact point 502 via a conductive plug, the contact pad 610 can be connected to the contact pad 510 via a conductive plug, and the contact pad 620 can be connected to the contact pad 520 via a conductive plug. The first and second planar spiral wirings can have, e.g., octagonal shapes.

In certain other embodiments, the planar spiral inductor disposed over the ground shield structure may have different shapes including, for example, triangular, square, circular or octagonal. The planar wiring inductor and the conductive wiring of the ground shield structure may have the same or different shapes. The planar spiral inductor can have multi-layer planar spiral wirings, and the planar spiral inductor can have the same or different wiring shape as that of the ground shield. In other embodiments, electronic devices, such as transformer, balun, etc., can be formed over the ground shield structure. Such electronic devices can generate a magnetic field and form an eddy current in the substrate, thereby causing an eddy current loss.

Referring to FIG. 11, electronic devices 1160, such as inductor, Transformer, balun, etc. can have projections on the substrate 1130, and those projections can be disposed within the projection of the ground shield structure 1140 on the substrate 1130, thereby ensuring that the magnetic field generated by the electronic devices is perpendicularly to the substrate and within the area of the ground shield in the ground shield structure 1140.

In one embodiment, an inductor can be formed on a ground shield, and the inductor can have a projection on the substrate, and the projection can be disposed within the projection of the ground shield. The inductor can generate a magnetic field perpendicular to the substrate, and the magnetic field can be disposed within the ground shield. The conductive wirings of the ground shield can have openings so that a closed circuit cannot be formed. Therefore, the magnetic field generated by the inductor may not generate in the ground shield an induction current, which may otherwise generate a magnetic field opposite to the direction of the magnetic field of the inductor. This can prevent the loss of the magnetic energy of the inductor in the ground shield. At the same time, since the conductive wiring of the ground shield disposed between the substrate and the inductor can have a smaller resistance than the substrate, the electric field lines of the inductor may be terminated at the surface of the shield layer and may not penetrate into the substrate, thereby reducing the consumption of electric energy in the substrate. In addition, a metal wire can connect the wirings on the top layer of the ground shield from the inside to the outside, and the metal wire can connect the inner and outer wirings to the ground. Therefore, all the junctions (connecting to each wiring) on the metal wire can have a fixed potential. However, since the metal wire can have a resistance and an individual conductive wiring may have certain length and resistance, the potentials of the positions away from the junction may be different. Therefore, coupling capacitors may appear at high frequencies. For high frequency signals, potential difference may be produced. At high frequencies, the unconnected regions of the wirings within the same layer may form equivalent series coupling capacitors. The conductive wiring in the middle can serve as the lower plate of a coupling capacitor formed with an adjacent inner conductive wiring, at the same time this conductive wiring can also serve as the upper plate of a coupling capacitor formed with an adjacent outer conductive wiring. The more the number of conductive wirings within one layer, the more the equivalent series coupling capacitors can be, and the smaller the actual capacitance can be. Reducing the capacitance of the coupling capacitors can lower the energy consumption, which in turn improves the Q value of the inductor, and reduce the substrate consumption of the electronic devices of inductor, transformer, balun, etc.

Further, the conductive wirings disposed on the ground shield can be nearly perpendicular to the direction of the divergent electric field generated by the electric devices disposed over the conductive wirings, thereby shielding off, to a great extent, the influence of electric field on other regions of the substrate, and reducing the substrate loss.

Figure 10:
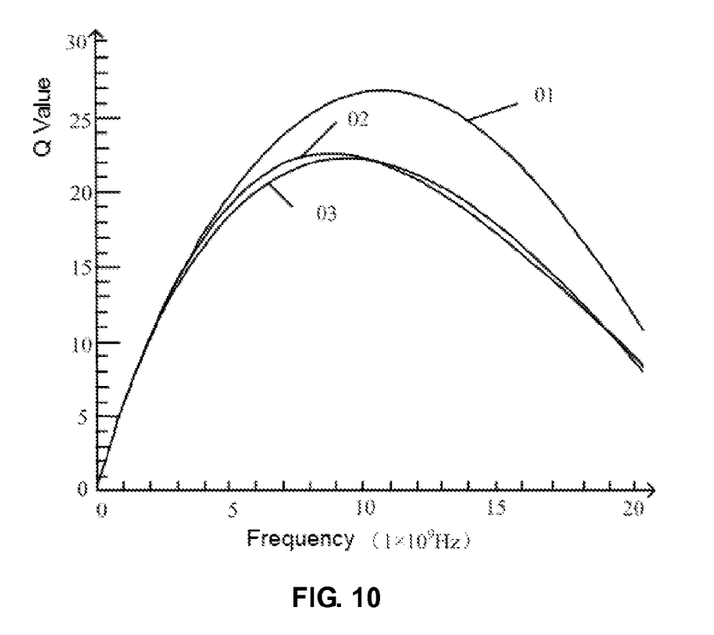
FIG. 10 depicts Q value plots versus frequencies for an inductor having a ground shield in accordance with various disclosed embodiments, an inductor having no ground shield, and an inductor having a conventional ground shield.

FIG. 10 depicts that an exemplary inductor having a disclosed ground shield with an improved Q value. Specifically, plot 01 shows the Q value of the exemplary inductor having the ground shield formed in accordance with various disclosed embodiments. Plot 02 shows the Q value of an inductor without a ground shield. Plot 03 shows the Q value of an inductor having a conventional ground shield as depicted in FIG. 1. Plot 01 shows the maximum Q value of about 26.8 at a frequency of about 10.4 GHz. Plot 02 shows the maximum Q value of about 22.3 at a frequency of about 8.3 GHz. Plot 03 shows the maximum Q value of about 22.3 at a frequency of about 9.3 GHz. As shown in FIG. 10, the Q value of the exemplary inductor having a ground shield formed in accordance with various disclosed embodiments is noticeably better, and the maximum Q value increased more than about 17%.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor device having a ground shield comprising:
    a substrate;
    a ground ring disposed over the substrate;
    a ground shield disposed over the substrate and surrounded by the ground ring, wherein the ground shield includes a plurality of coaxial conductive wirings and a metal wire passing through the plurality of coaxial conductive wirings along a radial direction, and the metal is connected to the ground ring,
    wherein the ground shield includes a multi-layer stacked structure including: an active layer including active wirings disposed over the substrate, and a polysilicon layer including polysilicon wirings disposed over the active layer;
    an electronic device disposed over the ground shield; and
    an insulation layer disposed between the ground shield and the electronic device.

2. A semiconductor device having a around shield, comprising:
    a substrate;
    a ground ring disposed over the substrate;
    a ground shield disposed over the substrate and surrounded by the ground ring, wherein the ground shield includes a plurality of coaxial conductive wirinig and a metal wire passing through the plurality of coaxial conductive wirings along a radial direction, and the metal wire is connected to the ground ring,
    wherein the ground shield includes a multi-layer stacked structure including: a polysilicon layer including polysilicon wirings disposed over the substrate, and a metal layer including metal wirings disposed over the polysilicon layer;
    an electronic device disposed over the ground shield; and
    an insulation layer disposed between the ground shield and the electronic device.

3. The device of claim 1, wherein the ground shield further includes a metal layer including metal wirings disposed over the polysilicon layer.

4. The device of claim 1, wherein the plurality of coaxial conductive wirings includes metal wirings and each of the metal wirings includes a single-layer structure or a multi-layer stacked structure.

5. A semiconductor device having a ground shield comprising:
    a substrate;
    ground ring disposed over the substrate;
    a ground shield disposed over the substrate and surrounded by the ground ring, wherein the ground shield includes a plurality of coaxial conductive wirings and a metal wire passing through the plurality of coaxial conductive wirings along a radial direction, and the metal wire is connected to the ground ring,
    wherein the ground shield includes a multi-layer stacked structure and the metal wire passes through the plurality of coaxial conductive wirings of an uppermost layer of the multi-layer stacked structure and connects to the ground ring;
    an electronic device disposed over the ground shield; and
    an insulation layer disposed between the ground shield and the electronic device.

6. The device of claim 1, wherein each of the plurality of coaxial conductive wirings includes one or two openings.

7. The device of claim 1, wherein the plurality of coaxial conductive wirings includes active wirings made of a material including silicon, germanium, gallium arsenide, silicon germanium, or a combination thereof.

8. The device of claim 7, wherein a surface of the active wirings includes a metal silicide layer.

9. The device of claim 1, wherein the plurality of coaxial conductive wirings in each layer of the multi-layer stacked structure of the ground shield includes about 2 to about 100 coaxial conductive wirings.

10. The device of claim 1, wherein the plurality of coaxial conductive wirings has a shape selected from a triangular, square, circular, or octagonal shape, and has a width of about 0.1 μm to about 100 μm.

11. The device of claim 1, wherein the electronic device includes an inductor, a transformer, or a balun.

12. The device of claim 1, wherein a projection of the electronic device on the substrate is within a projection of the ground shield on the substrate.

13. The device of claim 2, wherein the ground shield further includes an active layer including active wirings disposed between the substrate and the polysilicon layer including polysilicon wirings.

14. The device of claim 2, wherein the plurality of coaxial conductive wirings includes metal wirings and each of the metal wirings includes a single-layer structure or a multi-layer stacked structure.

15. The device of claim 2, wherein the plurality of coaxial conductive wirings includes active wirings made of a material including silicon, germanium, gallium arsenide, silicon germanium, or a combination thereof, and a surface of the active wirings includes a metal silicide layer.

16. The device of claim 2, wherein the plurality of coaxial conductive wirings in each layer of the multi-layer stacked structure of the ground shield includes about 2 to about 100 coaxial conductive wirings.

17. The device of claim 2, wherein the plurality of coaxial conductive wirings has a shape selected from a triangular, square, circular, or octagonal shape, and has a width of about 0.1 μm to about 100 μm.

18. The device of claim 5, wherein the plurality of coaxial conductive wirings includes metal wirings and each of the metal wirings includes a single-layer structure or a multi-layer stacked structure.

19. The device of claim 5, wherein the plurality of coaxial conductive wirings includes active wirings made of a material including silicon, germanium, gallium arsenide, silicon germanium, or a combination thereof, and a surface of the active wirings includes a metal silicide layer.

20. The device of claim 5, wherein the plurality of coaxial conductive wirings has a shape selected from a triangular, square, circular, or octagonal shape, and has a width of abut 0.1 μm to about 100 μm.

* * * * *